United States Patent [19]

Whitehouse

[11] Patent Number: 4,496,398

[45] Date of Patent: Jan. 29, 1985

[54] ANTIREFLECTIVE COATING COMPOSITION

[75] Inventor: Daniel L. Whitehouse, Clarksburg, Md.

[73] Assignee: Solarex Corporation, Rockville, Md.

[21] Appl. No.: 544,975

[22] Filed: Oct. 24, 1983

Related U.S. Application Data

[63] Continuation-in-part of Ser. No. 341,128, Jan. 20, 1982, Pat. No. 4,411,703.

[51] Int. Cl.³ .......................... C08L 1/28; C07F 7/28; B05D 1/18
[52] U.S. Cl. .................................... 106/181; 106/189; 106/193 R; 427/74; 427/427; 427/226
[58] Field of Search ................... 536/88, 89; 106/181, 106/190; 524/112

[56] References Cited

U.S. PATENT DOCUMENTS

| | | | |
|---|---|---|---|
| 2,118,663 | 5/1938 | Bradshaw | 536/89 |
| 4,156,622 | 5/1979 | Lindmayer | 136/89 |
| 4,201,798 | 5/1980 | Lindmayer | 427/74 |
| 4,246,043 | 1/1981 | Lindmayer | 136/256 |
| 4,328,260 | 5/1982 | Whitehouse | 427/75 |
| 4,331,703 | 5/1982 | Lindmayer | 427/37 |
| 4,347,263 | 8/1982 | Whitehouse | 427/74 |
| 4,411,703 | 10/1983 | Whitehouse | 106/193 R |

*Primary Examiner*—Theodore Morris
*Attorney, Agent, or Firm*—Finnegan, Henderson, Farabow, Garrett & Dunner

[57] ABSTRACT

A metal organic paste. The paste contains a metal alkoxide, a thickening or suspension agent, a solvent for the alkoxide and an effective amount of an anhydride.

10 Claims, No Drawings

ANTIREFLECTIVE COATING COMPOSITION

BACKGROUND OF THE INVENTION

This is a continuation-in-part application of U.S. application Ser. No. 341,128, filed on Jan. 20, 1982, now U.S. Pat. No. 4,411,703 which relates generally to solar energy cells and more specifically to anti-reflective coatings for such cells and a method of applying such coatings.

The present invention relates to an improved metal-organic paste which may be used as an antireflective coating, preferably, on solar energy cells.

In a semiconductor device, a silicon wafer that has previously been doped with an impurity to adopt a specific polarity, is subjected to an impurity of the opposite polarity, thus forming an electrical junction. More specifically, if a silicon wafer is doped with boron, establishing a p-type polarity, a subsequent diffusion of phosphorus will result in a wafer having a p-n junction near one surface.

A junction having been established, radiant energy, usually in the form of light impinging on the surface, is rapidly absorbed as it penetrates the semiconductor material and generates free electrons and holes in pairs. The minority carriers of the hole-electron pairs, in the region of their generation, either recombine with the majority carriers or cross the p-n junction.

Those minority carriers which cross the p-n junction cause the cell body to become biased. The electrons flow into the n-type region and the holes into the p-type region. This bias results in the generation of a useful electrical current which flows when the two regions are connected externally by an electrical conductor.

The efficiency, i.e., the power output/power input of a solar cell, is directly related to the amount of useful light (carrier generating light) which is absorbed by the solar cell. The efficiency of the solar cell is limited because some of the light, both useful and nonuseful, striking the top surface of the cell is reflected.

To reduce this reflection, an antireflective coating is positioned on the surface of the solar cell through which light enters the cell. A properly functioning antireflective coating must reduce reflection of the useful light and must not absorb the useful light, but should enable the light to pass to the underlying cell. The use of a particular antireflective material is therefore dependent upon the refractive index of the underlying solar cell, as well as the absorption band wavelengths for that solar cell.

In my aforementioned application Ser. No. 341,128, for which the issue fee has been paid and the disclosure of which is specifically incorporated by reference herein, a facile and economical means was described for the deposition of an antireflective coating, which means do not require sophisticated vacuum equipment for evaporating metals or metal oxides.

In the process of that invention, a paste of a metal organic salt was screen printed onto the surface of the cell and the metal organic salt was converted to its metal oxide by heat treatment. The metal organic salts normally utilized are the alkoxides, such as methoxide, ethoxide, n-propoxide, isopropoxide, butoxide, phenoxide and pentyloxide. The metal utilized in this process is selected from the group consisting of tantalum, niobium, tantanium, tellurium, zirconium, and yttrium or combinations of these metals.

The characteristics of the coating obtained, such as index of refraction, dielectric constant, hardness, porosity, light absorbtion, chemical stability and other chemical, physical, electronic and optical properties, can be selected without undue experimentation by the proper selection of the alkoxide preparation for the particular cell to be coated.

The thickness of the coating obtained is easily determined by the metal concentration of the alkoxide paste and the mesh of the screen utilized and is preferably approximately one-quarter wavelength of light energy having a wavelength in the range of about 0.5 to 0.75 microns.

In the preparation of the metal organic paste, a thickening or suspension agent, such as ethyl cellulose or methyl cellulose, is mixed with a compatible liquid to form a base paste. The liquid, which acts as a solvent for the thickening or suspension agent, is commonly an aliphatic alcohol having at least six carbon atoms, such as 2-ethylhexanol-1, or a terpene, such as $\alpha$-terpineol. Other known liquid alcohols, such as benzyl alcohol and other aromatic alcohols, terpenes and thickening or suspension agents, can also be utilized.

To this base paste is added either a metal alkoxide or a mixture of metal halide, preferably metal chloride, and an alcohol, as described above, to form a metal organic paste. In neither case must all the halogens of the metal be replaced by an alcohol group. Depending on the metal selected, when the metal and alcohol is added as a mixture, there is either a reaction between the two components or a complex of the two components or possibly both to form a metal alkoxide in situ. The ratio of the metal halide to alcohol in a mixture of the two components is about 1/1 to about 1/3, with a preferred ratio of 1/2.

The preferred ratio of thickening agent to alcohol utilized to form an acceptable metal organic paste is in the range of about 2/1 to about 1/20. The preferred ratio of metal organic paste to metal alkoxide or mixture of metal halide and alcohol is in the range of about 10/1 to 50/1.

After the paste is applied to the substrate, using either an open or a patterned screen, by means well-known in the art, the substrate is heated in the range of about 300° C. to 1000° C. for approximately one to sixty minutes or longer. It has been found that the best antireflective characteristics are obtained when the substrate is heated gradually to a temperature of approximately 500° C. within one (1) minute after the initial application of heat and maintained at that temperature for five (5) minutes.

SUMMARY OF THE INVENTION

The present invention overcomes the shortcomings associated with my previous metal organic paste. Accordingly, it is a primary object of this invention to provide an improved formulation for an antireflective metal organic paste having improved stability which thereby provides denser films of higher refractive index.

It is a further object of this invention to provide an improved formulation for an antireflective metal organic paste whose thickness is more readily controlled and is thereby more effective as an antireflective coating and plating mask.

These objectives are achieved by utilizing a composition suitable for application onto the light impinging surface of a substrate for forming an antireflective coating thereon comprising a thickening or suspension agent, a metal alkoxide, a solvent for the alkoxide, and an effective amount of an anhydride containing four to twelve carbon atoms.

The invention also provides a method of applying an anti-reflective metal organic paste to a substrate for forming an antireflective coating thereon comprising the steps of applying a metal alkoxide paste onto a substrate, and heating the substrate to a temperature in the range of about 300° C. to about 1000° C. to decompose the alkoxide and form a metal oxide antireflective coating. If the substrate is silicon it may be immersed in an ammonium flouride/hydrofluoric acid bath to remove any silicon oxide layer that may have formed on the uncoated areas of the substrate during the heating process. Additionally, the areas of the substrate containing no metal oxide coating may be plated with a nickel compound to form a metallic grid.

Additional objects and advantages of the invention will be set forth in part in the description which follows and in part will be obvious from the description, or may be learned by practice of the invention. The objects and advantages of the invention may be realized and obtained by means of the instrumentalities and combinations particularly pointed out in the appended claims.

DETAILED DESCRIPTION OF THE PREFERRED EMBODIMENTS

Reference will now be made in detail to the presently preferred embodiments of the invention.

In accordance with the invention, a thickening or suspension agent is mixed with a compatible liquid solvent to form a base paste. The preferred thickening or suspension agents are ethyl cellulose and methyl cellulose. However, other commercially available thickening or suspension agents may also be employed.

The compatible liquid component also serves as a medium for the alkoxide subsequently introduced into the base paste. Suitable liquids include aliphatic alcohols having at least six carbon atoms, aromatic alcohols and terpenes. More particularly, 2-ethylhexanol-1, $\alpha$-terpineol, or benzyl alcohol is suitable.

The preferred ratio of thickening agent to alcohol used to form an acceptable metal organic paste is in the range of about 2/1 to about 1/20 by weight of the entire composition.

A metal organic paste is formed by adding to the base paste either a metal alkoxide or a mixture of metal halide and an alcohol which will form in situ a metal alkoxide. The metal utilized is selected from the group consisting of tantalum, niobium, titanium, tellurium, zirconium, and yttrium or combinations of these metals. The alkoxides commonly utilized or formed in situ are methoxide, ethoxide, n-propoxide, isopropoxide, butoxide, phenoxide and pentyloxide. The preferred ratio of metal organic paste to metal alkoxide is in the range of about 10/1 to 50/1 by weight of the entire composition.

In accordance with the present invention, where a metal halide and alcohol are mixed to form the alkoxide, the ratio of the metal halide to alcohol is in the range of about 1/1 to 1/3 by weight. The preferred ratio of metal halide to alcohol is 1/2 by weight. Any suitable metal halide may be utilized, but metal chloride is preferred. If an alcohol is used to form a metal alkoxide in situ, the alcohol may be the same as or different from the liquid which acts as a solvent for the thickening or suspension agent.

In accordance with the invention, to this metal organic paste is added an effective amount of an anhydride containing four to twelve carbon atoms. Suitable anhydrides include acetic anhydride, propanoic anhydride, butanoic anhydride, pentanoic anhydride, hexonoic anhydride and benzoic anhydride. The preferred anhydride is acetic anhydride. It has been determined that an effective amount of anhydride is in the range of about 0.07% to about 6.75% by weight of the total composition. Use of amounts of anhydride above 6.75% by weight may have an undesirable effect on the texture of the paste.

In practicing one embodiment of the method of this invention a metal organic paste, containing metal alkoxide, a thickening or suspension agent, a solvent and an anhydride, as described above, is screen-printed, by means well-known in the art, onto the light impinging surface of a substrate, preferably a solar cell, and the metal organic salt contained therein is converted to its oxide by heat treatment. The screen is coated with an appropriate, well-known emulsion layer in all areas other than those through which the metal organic paste is intended to pass. The thickness of the metal alkoxide coating, as is well known in the art, may be controlled by adjusting the screen printing apparatus.

Silicon wafers, which are processed to form solar cells by methods known to those of ordinary skill in the art, are commercially available. The metal organic paste may also be used on other substrates. For example, the metal organic paste may be used as an oxide layer for passivation coating, as an antireflective coating, as a dielectric layer, or as a diffusion barrier on silicon devices or other suitable substrates.

The substrate is heated in the range of from about 300° C. to 1000° C., preferably 300° C. to 550° C., for approximately one to 60 minutes or longer. More preferably, the substrate is gradually heated to a temperature of 500° C. within one (1) minute after the first application of heat and maintained at that temperature for a period of five (5) minutes. If the substrate is silicon, a silicon oxide layer may form on the uncoated portions of the substrate during the heating process. To remove this layer, without damaging the antireflective coating, the substrate should be immersed in an ammonium flouride/hydroflouric acid bath with a pH of approximately 7.3.

The preferred ratio of ammonium flouride to hydroflouric acid is 1600 parts 40% solution ammonium flouride to 1 part 45% solution hydroflouric acid. The substrate should remain immersed until a visual inspection indicates that the silicon oxide layer has been dissolved, i.e. until the silicon becomes hydrophobic. Preferably, the substrate is then plated with a standard nickel plating solution, by means well-known in the art, to form a grid structure.

As an embodiment of this invention the screen may be removed after heat treatment of the cell. In this embodiment the screen material is composed of material which will withstand heat in the range of about 300° C. to about 500° C. Such material is known. It is preferred, however, that the screen be removed prior to heat treatment.

The thickness of the coating obtained is easily determined by the amount of alkoxide paste utilized and is preferably approximately one-quarter wavelength of light energy having a wavelength in the range of about 0.5 to 0.75 microns. The actual thickness of the coating obtained can be determined by various known instruments which are available for that purpose.

The following examples were designed to elucidate the teachings of the present invention, and in no way limit the scope of the invention. Various quantities of acetic anhydride were added to an antireflective paste prepared in accordance with this invention to evidence its ability to prevent the polymerization of the paste and thereby stabilize it and lengthen its shelf life. Various other modifications and equivalents of the examples will readily suggest themselves to those of ordinary skill in the art, particularly after the issuance of this patent, without departing from the spirit or scope of the present invention.

EXAMPLE I

A control metal organic paste, consisting of 500 grams of 2-ethyl-hexanol, 40 grams of ethyl cellulose, and 12.5 grams of tantalum ethoxide, was tested for increase in viscosity over a fourteen-day period. Viscosity measurements were taken with a Wells-Brookfield viscometer having a CP-52 spindle. The paste's viscosity was recorded over a 0.5–100 revolutions per minute (r.p.m.) range on the second, sixth, and fourteenth day after preparing the paste. The recorded changes in viscosity follow:

| With a Wells-Brookfield Viscometer Spindle CP-52 | | | |
|---|---|---|---|
| Revolutions per Minute | Day 2 | Day 7 | Day 14 |
| 0.5 | 1.5 | 5.9 | 8.4 |
| 1 | 2.3 | 6.6 | 10.7 |
| 2.5 | 4.5 | 9.7 | 14.4 |
| 5 | 7.5 | 14.0 | 18.0 |
| 10 | 12.2 | 19.6 | 24.3 |
| 20 | 18.9 | 27.6 | 31.5 |
| 50 | 32.0 | 40.5 | 45.6 |
| 100 | 45.6 | 54.7 | 59.2 |
| 100 | 45.1 | 50.9 | 53.5 |
| 50 | 30.4 | 36.1 | 38.9 |
| 20 | 16.6 | 20.7 | 24.0 |
| 10 | 9.9 | 14.6 | 16.8 |
| 5 | 5.7 | 9.8 | 11.2 |
| 2.5 | 3.2 | 6.0 | 8.2 |
| 1 | 1.4 | 3.5 | 4.2 |
| 0.5 | .8 | 2.3 | 2.7 |

EXAMPLE II

The procedure described in Example I was repeated except that 6.32 grams of acetic anhydride were added to the metal organic paste. Recorded changes in viscosity follow:

| With a Wells-Brookfield Viscometer Spindle CP-52 | | | |
|---|---|---|---|
| Revolutions per Minute | Day 2 | Day 7 | Day 14 |
| 0.5 | 2.7 | 5.5 | 2.0 |
| 1 | 4.0 | 6.2 | 3.5 |
| 2.5 | 6.7 | 7.8 | 5.7 |
| 5 | 9.1 | 10.2 | 8.9 |
| 10 | 13.0 | 13.6 | 10.6 |
| 20 | 19.0 | 19.5 | 18.0 |
| 50 | 30.5 | 29.8 | 28.1 |
| 100 | 43.0 | 42.4 | 40.3 |
| 100 | 41.4 | 40.8 | 38.7 |
| 50 | 28.0 | 28.3 | 26.4 |
| 20 | 15.8 | 15.8 | 15.1 |
| 10 | 9.9 | 10.8 | 9.8 |
| 5 | 6.0 | 6.9 | 6.2 |
| 2.5 | 3.6 | 4.4 | 3.8 |
| 1 | 1.8 | 2.3 | 2.0 |

| With a Wells-Brookfield Viscometer Spindle CP-52 | | | |
|---|---|---|---|
| Revolutions per Minute | Day 2 | Day 7 | Day 14 |
| 0.5 | 1.1 | 1.4 | 1.2 |

EXAMPLE III

The procedure described in Example I was repeated except that 25.3 grams acetic anhydride were added to the metal organic paste. Recorded changes in viscosity follow:

| With a Wells-Brookfield Viscometer Spindle CP-52 | | | |
|---|---|---|---|
| Revolutions per Minute | Day 2 | Day 7 | Day 16 |
| 0.5 | 1.0 | 2.0 | 1.3 |
| 1 | 1.7 | 3.1 | 2.2 |
| 2.5 | 3.1 | 5.0 | 4.0 |
| 5 | 4.8 | 6.6 | 5.9 |
| 10 | 7.5 | 9.4 | 8.9 |
| 20 | 12.4 | 13.7 | 13.3 |
| 50 | 27.4 | 27.6 | 22.0 |
| 100 | 34.1 | 33.0 | 31.7 |
| 100 | 34.1 | 31.7 | 30.4 |
| 50 | 21.2 | 20.4 | 19.5 |
| 20 | 11.0 | 11.0 | 10.6 |
| 10 | 6.3 | 6.7 | 6.4 |
| 5 | 3.6 | 4.0 | 3.7 |
| 2.5 | 1.9 | 2.3 | 2.3 |
| 1 | .8 | 1.1 | 1.2 |
| 0.5 | .4 | .7 | .6 |

EXAMPLE IV

The procedure described in Example I was repeated except that 1.58 grams of acetic anhydride were added to the metal organic paste. Recorded changes in viscosity follow:

| With a Wells-Brookfield Viscometer Spindle CP-52 | | | |
|---|---|---|---|
| Revolutions per Minute | Day 2 | Day 7 | Day 16 |
| 0.5 | 5.0 | 5.2 | 2.9 |
| 1 | 7.0 | 7.2 | 4.4 |
| 2.5 | 10.9 | 9.6 | 7.4 |
| 5 | 10.0 | 12.5 | 10.2 |
| 10 | 14.0 | 17.0 | 13.6 |
| 20 | 21.0 | 22.0 | 19.2 |
| 50 | 32.5 | 33.9 | 29.4 |
| 100 | 45.4 | 48.6 | 41.5 |
| 100 | 44.3 | 45.6 | 43.8 |
| 50 | 30.9 | 31.2 | 31.5 |
| 20 | 17.9 | 19.0 | 15.4 |
| 10 | 11.4 | 12.6 | 11.0 |
| 5 | 7.4 | 8.3 | 6.7 |
| 2.5 | 4.6 | 5.4 | 4.2 |
| 1 | 2.4 | 2.9 | 2.0 |
| 0.5 | 1.6 | 1.9 | 1.1 |

EXAMPLE V

The procedure described in Example I was repeated except that 3.1 grams acetic anhydride were added to the metal organic paste. Viscosity measurements were taken as indicated.

| With a Wells-Brookfield Viscometer Spindle CP-52 | | |
| --- | --- | --- |
| Revolutions per Minute | Day 2 | Day 10 |
| 0.5 | 3.0 | 5.2 |
| 1 | 3.5 | 6.0 |
| 2.5 | 6.1 | 8.5 |
| 5 | 8.6 | 10.4 |
| 10 | 12.9 | 14.0 |
| 20 | 18.9 | 20.3 |
| 50 | 30.5 | 30.6 |
| 100 | 42.6 | 43.1 |
| 100 | 41.8 | 42.4 |
| 50 | 27.8 | 29.3 |
| 20 | 15.9 | 17.1 |
| 10 | 10.0 | 11.2 |
| 5 | 6.0 | 7.1 |
| 2.5 | 3.7 | 4.5 |
| 1 | 1.8 | 2.3 |
| 0.5 | 1.0 | 1.4 |

EXAMPLE VI

The procedure described in Example I was repeated except that 6.25 grams of acetic anhydride were added to the metal organic paste. Viscosity measurements were taken as indicated.

| With a Wells-Brookfield Viscometer Spindle CP-52 | | |
| --- | --- | --- |
| Revolutions per Minute | Day 2 | Day 10 |
| 0.5 | 2.7 | 2.7 |
| 1 | 3.0 | 3.9 |
| 2.5 | 5.4 | 5.9 |
| 5 | 7.8 | 8.6 |
| 10 | 11.7 | 11.5 |
| 20 | 18.0 | 17.0 |
| 50 | 28.5 | 27.8 |
| 100 | 40.6 | 39.5 |
| 100 | 38.5 | 37.5 |
| 50 | 26.4 | 25.7 |
| 20 | 14.7 | 14.2 |
| 10 | 9.2 | 9.1 |
| 5 | 5.4 | 5.6 |
| 2.5 | 5.3 | 3.4 |
| 1 | 1.6 | 1.7 |
| 0.5 | .9 | .9 |

Comparing Example I to Examples II to VI, one sees that use of acetic anhydride stabilizes viscosity over time, particularly at high shear rates. Stabilized viscosity at high shear rates is significant because the most critical phases of screen printing processes involve high shear rates.

EXAMPLE VII

To evidence the ability of an anhydride to curtail the premature conversion of metal alkoxides in the paste to metal oxides and thereby provide a denser paste with a higher refractive index, the following tests were conducted.

EXAMPLE VIIA

A metal organic paste as described in Example I was applied to a substrate using a 250 mesh screen. The paste was subsequently fired in a diffusion tube through which flowed 2.3 liters per minute nitrogen and 0.56 liters per minute oxygen either fed directly from a tank or humidified to approximately 94% saturation. Two wafers were fired simultaneously with a three-inch separation of centers providing peak temperatures of either 500° C. or 525° C. maintained for a six-minute span.

| Wafer | Gas Tube Atmosphere | Temperature |
| --- | --- | --- |
| 1 | Humid | 550° C. |
| 2 | Humid | 525° C. |
| 3 | Humid | 550° C. |
| 4 | Dry | 525° C. |
| 5 | Dry | 550° C. |
| 6 | Dry | 525° C. |
| 7 | Dry | 525° C. |

After firing, all the wafer substrates possessed an identical dark blue color indicating sufficient antireflective characteristics.

EXAMPLE VIIB

Identical wafer substrates were prepared as described in Example I and fired two at a time in a tube furnance with a time and temperature profile as described in Example VIIA. Prior to firing, wafers 5, 6, 7, and 8 were placed in a container through which 40° C.-95% relative humidity air flowed for ten minutes before firing.

| Wafer | Gas-Tube Atmosphere | Temperature | Exposure |
| --- | --- | --- | --- |
| 1 & 2 | dry | 550° C. | |
| 3 & 4 | dry | 525° C. | 10 min 90° C. prebake |
| 5 & 6 | dry | 550° C. | 10 minutes humid air |
| 7 & 8 | humid | 525° C. | 10 minutes humid air |
| 9 & 10 | humid | 550° C. | |
| 11 & 12 | humid | 525° C. | 10 min 90° C. prebake |

After firing, wafers 1 through 4 and 9 through 12 were a dark blue color evidencing good antireflective qualities. However, wafers 5, 6, 7, and 8 displayed a lighter blue color evidencing the effect that moisture, accumulated prior to firing, has on the metal organic paste.

After nickel plating, wafers 1 through 4 still possessed a good dark blue color while wafer 5 through 8 turned yellow. Wafers 9 through 12 were slightly lighter in color than wafer 1 through 4, but did not display the characteristic yellow color associated with wafers exposed to humid air.

EXAMPLE VIIC

Additional wafers were prepared. Numbers 1 and 2 were coated with a metal organic paste as described in Example I. Numbers 3-7 were prepared and coated with 53 grams of a metal organic paste identical to that of Example I but for the addition of 0.25 cc of acetic anhydride. Subsequently, the wafers were fired in a tube furnance of the same profile as described in Example VIIA.

| Number | Metal Organic Paste | Exposure to Humid Air | Tube Atmosphere |
| --- | --- | --- | --- |
| 1 | Example I | none | dry |
| 2 | Example I | none | water* |
| 3 | Example I plus acetic anhydride | none | dry |
| 4 | Example I plus acetic anydride | 5 min. | dry |

-continued

| Number | Metal Organic Paste | Exposure to Humid Air | Tube Atmosphere |
|---|---|---|---|
| 5 | Example I plus acetic anhydride | 5 min. | dry |
| 6 | Example I plus acetic anhydride | 10 min. | dry |
| 7 | Example I plus acetic anhydride | 10 min. | dry |

*Water was injected into firing tube throughout firing cycle.

After nickel plating, none of the wafers evidenced any significant degree of yellowing.

EXAMPLE VIID

Additional wafers were prepared and half (normal) were coated with a metal organic paste as described in Example I and half (AA) were coated with 53 grams of a metal organic paste identical to that described in Example I but for the addition of 0.25 cc acetic anhydride. Subsequently, the wafers were fired in a tube furnace of the same profile as described in Example VIIA.

| Wafer | Metal Organic Paste | Exposure To Humid Air | Temperature |
|---|---|---|---|
| 1* | normal | none | 530° C. |
| 2 | AA | none | 550° C. |
| 3 | normal | none | 550° C. |
| 4 | AA | none | 530° C. |
| 5 | AA | 90 sec. | 550° C. |
| 6 | normal | 90 sec. | 530° C. |
| 7 | AA | 5 min. | 550° C. |
| 8 | normal | 5 min. | 530° C. |
| 9 | AA | 5 min. | 530° C. |
| 10 | normal | 5 min. | 550° C. |
| 11 | AA | none | 530° C. |
| 12 | normal | none | 550° C. |

*Wafer 1 was fired separately while wafers 2-12 were fired simultaneously in pairs.

Those wafers coated with the acetic anhydride paste maintained a good blue color with even distribution. The prehumidified wafers displayed the characteristic yellow color associated with poor antireflective quality. The metal organic paste containing acetic anhydride maintained its desirable blue color after metal plating as did the non-humidified wafers coated with the normal paste. However, the humidified samples coated with the normal paste evidenced extreme yellowing upon nickel plating.

EXAMPLE VIII

A paste was prepared from 500 grams of 2-ethyl-1-hexanol, 40 grams ethyl cellulose (100 centipoise), 12.5 grams tantalum-ethoxide and 2.7 grams of acetic anhydride. The resulting essentially homogeneous paste was then screen printed onto the light impinging surface of a silicon substrate having a 250 mesh stainless steel screen. The silicon substrate was then heated gradually to a temperature of 500° C. within one (1) minute of the initial application of heat and maintained at that temperature for five (5) minutes. To remove any silicon oxides which formed on the uncoated surface of the substrate during the heating process, the substrate was immersed in an ammonium fluoride/hydroflouric acid bath, with an approximate pH of 7.3, until a visual inspection indicated the dissolution of the silicon oxide coating. The bath was prepared by mixing 1600 parts 40% solution ammonium fluoride to 1 part 45% solution hydrofluoric acid. Following the acid bath treatment, the uncoated portion of the substrate was plated with a standard nickel plating solution, thereby forming a grid structure.

What is claimed is:

1. A composition suitable for application onto the light impinging surface of a substrate for forming an antireflective coating thereon comprising:
   (a) a thickening or suspension agent;
   (b) a metal alkoxide, said metal being selected from the group consisting of tantalum, titanium, niobium, yttrium, zirconium, tellurium, and mixtures thereof;
   (c) a solvent for said thickening or suspension agent; and
   (d) an anhydride containing four to twelve carbon atoms, said anhydride being present in an amount effective to provide a denser film of a higher refractive index.

2. The composition of claim 1, wherein the thickening or suspension agent is selected from the group consisting of methylcellulose and ethylcellulose.

3. The composition of claim 1, wherein said solvent is selected from the group consisting of an aliphatic alcohol having at least six carbon atoms, an aromatic alcohol, and a terpene.

4. The composition of claim 3, wherein said solvent is selected from the group consisting of 2-ethylhexanol-1, α-terpineol, and benzyl alcohol.

5. The composition of claim 1, wherein the amount of anhydride is in the range of about 0.07% to about 6.75% by weight of the total composition.

6. The composition of claim 1, wherein said anhydride is selected from the group of acetic anhydride, propanoic anhydride, butanoic anhydride, pentanoic anhydride, hexanoic anhydride and benzoic anhydride.

7. The composition of claim 1, wherein the metal alkoxide is formed from a mixture of a metal halide and an alcohol, said ratio of metal halide to alcohol in said mixture being about 1/1 to about 1/3 by weight.

8. The composition of claim 7, wherein said metal halide is metal chloride and wherein said ratio of metal chloride to alcohol is 1/2 by weight.

9. The composition of claim 1, wherein the ratio of thickening or suspension agent to alcohol is about 2/1 to 20/1 by weight, and wherein the ratio of both said thickening or suspension agent and said alcohol to said metal alkoxide is about 10/1 to 50/1 by weight.

10. The composition of claim 1, wherein the alkoxide is selected from the group consisting of methoxide, ethoxide, n-propoxide, isopropoxide, butoxide, phenoxide and pentyloxide.

* * * * *